(12) United States Patent
Alduino et al.

(10) Patent No.: US 7,130,111 B2
(45) Date of Patent: Oct. 31, 2006

(54) OPTICAL AMPLIFIER WITH TRANSVERSE PUMP

(75) Inventors: Andrew C. Alduino, San Jose, CA (US); Rongchung Tyan, Irvine, CA (US); Christopher J. Scholz, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/020,143

(22) Filed: Dec. 13, 2001

(65) Prior Publication Data
US 2003/0112495 A1    Jun. 19, 2003

(51) Int. Cl.
*H01S 3/00*    (2006.01)
(52) U.S. Cl. .............................. 359/341.32; 359/341.33
(58) Field of Classification Search ................ 359/134, 359/160, 341.3, 341.32, 341.33; 372/71, 372/70; 385/122
See application file for complete search history.

(56) References Cited

U.S. PATENT DOCUMENTS

| | | | | |
|---|---|---|---|---|
| 4,515,431 | A | | 5/1985 | Shaw et al. ................... 385/30 |
| 4,785,459 | A | * | 11/1988 | Baer ........................... 372/75 |
| 5,181,223 | A | * | 1/1993 | Baer ........................... 372/69 |
| 5,227,913 | A | | 7/1993 | McCaughan et al. |
| 5,271,031 | A | * | 12/1993 | Baer ........................... 372/93 |
| 5,365,538 | A | * | 11/1994 | Tumminelli et al. .......... 372/66 |
| 5,463,649 | A | * | 10/1995 | Ashby et al. ................. 372/40 |
| 5,535,051 | A | | 7/1996 | Basiev et al. |
| 5,761,234 | A | | 6/1998 | Craig et al. |
| 5,774,488 | A | * | 6/1998 | Kmetec ........................ 372/69 |
| 5,920,423 | A | | 7/1999 | Grubb et al. |
| 5,974,061 | A | * | 10/1999 | Byren et al. .................. 372/34 |
| 5,982,802 | A | * | 11/1999 | Thony et al. .................. 372/75 |
| 6,069,907 | A | * | 5/2000 | Chang ........................... 372/75 |
| 6,160,824 | A | * | 12/2000 | Meissner et al. ............... 372/7 |
| 6,212,310 | B1 | | 4/2001 | Waarts et al. |
| 6,243,515 | B1 | * | 6/2001 | Heflinger et al. ............. 385/37 |
| 6,288,833 | B1 | * | 9/2001 | Kasamatsu ................... 359/333 |
| 6,289,027 | B1 | * | 9/2001 | Lawrence et al. ............. 372/6 |
| 6,356,574 | B1 | | 3/2002 | Craig et al. |
| 6,418,156 | B1 | * | 7/2002 | Peressini ...................... 372/66 |
| 6,459,829 | B1 | | 10/2002 | Yamauchi et al. ............ 385/24 |
| 6,493,476 | B1 | | 12/2002 | Bendett |
| 6,594,420 | B1 | * | 7/2003 | Lange et al. .................. 385/36 |
| 6,625,182 | B1 | * | 9/2003 | Kuksenkov et al. .......... 372/19 |
| 6,721,087 | B1 | * | 4/2004 | Alduino et al. ............. 359/333 |
| 2002/0145139 | A1 | | 10/2002 | Wagner et al. ................ 257/53 |

FOREIGN PATENT DOCUMENTS

| | | |
|---|---|---|
| EP | 0 821 451 | 1/1998 |
| EP | 1 028 333 A2 | 8/2000 |
| EP | 1028333 A2 | 8/2000 |

(Continued)

OTHER PUBLICATIONS

R.J. Beach, et al. "Continuous-wave and passively Q-switched cladding-pumped planar waveguide lasers".Optics Letters, Optical Society of America, vol. 26, No. 12. Jun. 15, 2001. pp. 881-883 XP-001103481, ISSN: 0146-9592.

*Primary Examiner*—Deandra M. Hughes
(74) *Attorney, Agent, or Firm*—Blakely, Sokoloff, Taylor & Zafman LLP

(57) ABSTRACT

An optical amplifier comprises a device substrate, a first waveguide embedded in the device substrate, and a plurality of lasers. The lasers are positioned to provide a first plurality of light beams substantially transverse to the first waveguide.

17 Claims, 3 Drawing Sheets

FOREIGN PATENT DOCUMENTS

| | | |
|---|---|---|
| FR | 2 784 809 | 4/2000 |
| JP | 2001-189507 | 7/2001 |
| JP | 2001-308422 A | 11/2001 |
| WO | 87/04881 * | 5/1987 |
| WO | WO 01/28049 A2 | 4/2001 |
| WO | PCT/US 02/37677 | 12/2001 |
| WO | PCT/US 02/37696 | 12/2001 |
| WO | PCT/US 02/37677 | 11/2002 |
| WO | WO 03/052887 A1 | 6/2003 |
| WO | WO 03/052888 A1 | 6/2003 |

* cited by examiner

OPTICAL AMPLIFIER WITH TRANSVERSE PUMP

1. FIELD

The described invention relates to the field of optical signal amplification. In particular, the invention relates to amplifying an optical signal using transverse pumping light beams.

2. BACKGROUND

A waveguide may serve as an optical amplifier by doping it with ions of a rare earth element such as Erbium. An optical signal propagating in the waveguide is amplified when a pumping light beam is introduced. For example, Erbium ions, excited to a higher energy state with a pumping light beam having a wavelength of approximately 980 nm or 1480 nm, will amplify an optical signal in a wide wavelength band around 1530–1600 nm as the Erbium ions fall down to a lower energy state. This technique is well-known in optical fiber amplification.

FIG. 1 is a schematic diagram showing one prior art method of amplifying an optical signal 10 in a planar waveguide 20. The waveguide 20 is embedded in a substrate 30 and doped with Erbium ions. An optical signal 10 is directed into the waveguide 20 and propagates through the waveguide 20. A laser 50 supplies pumping light beams into the waveguide 20 in a co-propagating direction, i.e., in substantially the same direction as the optical signal propagates. The signal 10 and the pump 50 are combined to the same waveguide 20, for example, in an evanescent directional coupler. In one example, an optical signal 10 having wavelength of approximately 1550 nm is amplified as laser 50 supplies pumping light beams of approximately 980 nm or 1480 nm wavelength.

FIG. 2 is a schematic diagram showing another prior art method of amplifying an optical signal. In FIG. 2, a pump laser 50 is directed from the opposite end of the waveguide 20 to pump light in a counter-propagating direction, i.e., in a direction opposite to that of the optical signal. Similar to FIG. 1, the optical signal is amplified within the waveguide 20 and then exits the substrate 30.

Modern optical networks use single-mode optical fibers for transmission over long distances. This avoids signal degradation coming from chromatic dispersion, i.e. dependence of the speed of the light on its wavelength. For efficient interfacing with single mode fibers, all optical components, including fiber or waveguide amplifiers, are effectively single-mode. Due to a general principle of optics, "brightness conservation theorem", power of light in a single mode cannot be increased using just linear passive (not adding energy) optical elements. This results in a fact that the power of light with a certain wavelength from only one mode can be coupled to a single mode waveguide. For amplifiers, it translates that only one pump laser with a certain wavelength can supply pump light in each direction of propagation and each polarization.

The optical signal experiences gain in an optical amplifier provided that the intensity of the pump is higher than a certain threshold value dependent on the intensity of the optical signal and material properties of the optical amplifier. In order to achieve high enough gain, the intensity of the pump must be much higher than the threshold value. Consequently, a high power of a pump laser is typically required.

There are several disadvantages of the above methods compared to the invention described below. First, the relatively high power laser used in the described co-propagating and counter-propagating amplification is expensive. Second, high power lasers have a high power dissipation, which may cause thermal issues in their packaging. Third, the reliability of high power lasers is generally not as good as that of lower power lasers.

DETAILED DESCRIPTION

An apparatus and method for amplifying an optical signal in a waveguide is disclosed. In one embodiment, multiple lower power lasers are interspersed along a length of the waveguide to provide pumping light beams transverse to the direction of propagation of the optical signal.

Figure 1:
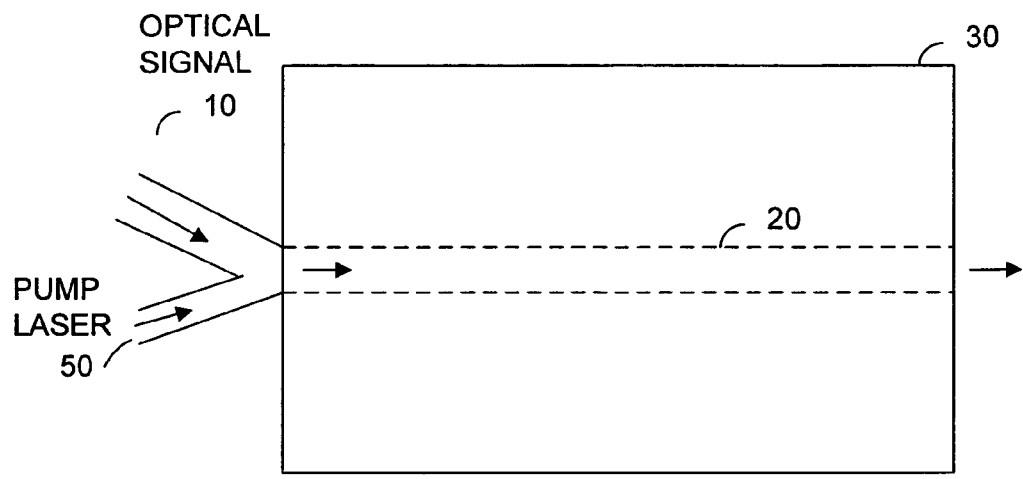
FIG. 1 is a schematic diagram showing one prior art method of amplifying an optical signal in a planar waveguide.
Figure 2:
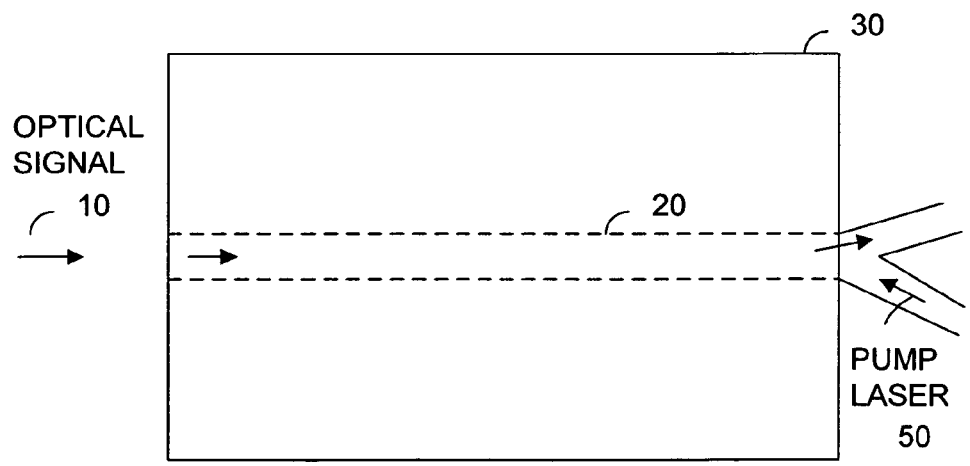
FIG. 2 is a schematic diagram showing another prior art method of amplifying an optical signal.
Figure 3:
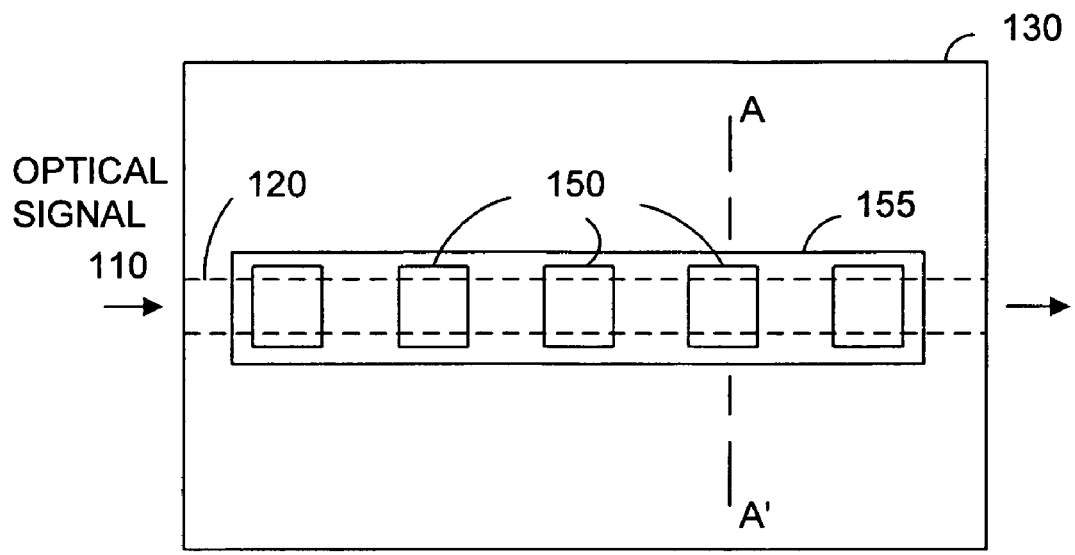
FIG. 3 is a schematic diagram showing a top view of one embodiment of an optical amplifier.

FIG. 3 is a schematic diagram showing a top view of one embodiment of an optical amplifier. An optical signal 110 enters into and propagates through waveguide 120, which is embedded in a substrate 130. There are various ways to fabricate a waveguide embedded in a substrate, such as by diffusion of various ionic species, etching, and epitaxial growth. "Embedded within a substrate" is meant to include these various ways, including silicon-on-insulator. In some cases, the waveguide may actually be deposited on top of a substrate and covered with a cladding material different from the substrate, but is also meant to be covered by the term "embedded within a substrate".

In one embodiment, waveguide 120 is a single-mode waveguide. A plurality of light sources 150, such as laser diodes, are coupled to the substrate 130 to direct the pumping light beams substantially transverse to the embedded waveguide 120.

In one embodiment, the light sources 150 are spaced evenly apart along the length of the embedded waveguide 120. However, other embodiments may include different spacings between light sources 150. In one embodiment, the light sources 150 comprise vertical cavity surface emitting lasers (VCSELs). The VCSELS may be fabricated from a common semiconductor substrate 155 and may be bonded to a surface of the device substrate 130. This allows lithographically-defined spacing between the VCSELs.

In one embodiment, the VCSELs use relatively low power. For example, a VCSEL may emit, but is not limited to, less than 20 mW of power. Comparable high power lasers used in co-propagating and counter-propagating architectures use higher power lasers, such as, but not limited to, 100 mW.

Figure 4:
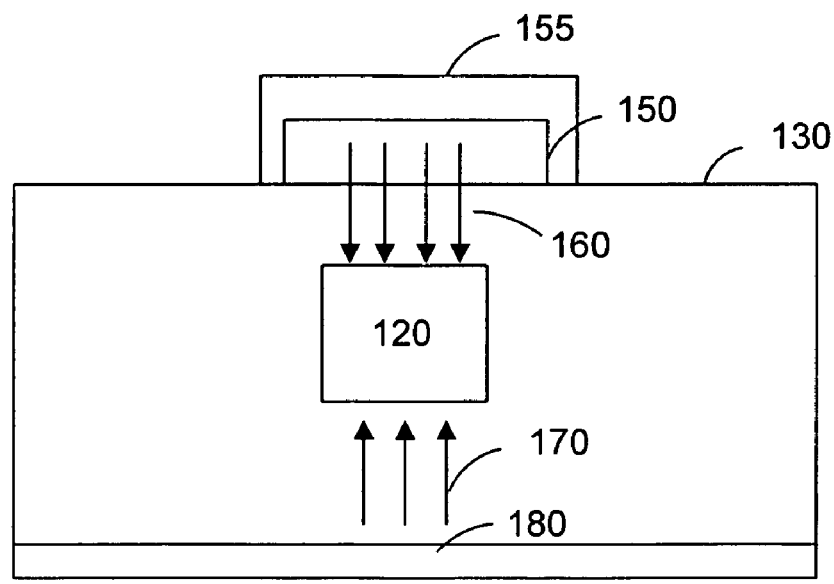
FIG. 4 is a schematic diagram showing a cross sectional view of an optical amplifier taken along line A—A' of FIG. 3.

FIG. 4 is a schematic diagram showing a cross sectional view of an optical amplifier taken along line A—A' of FIG. 3. In one embodiment, after the pumping light beam 160 from the light source 150 passes through the waveguide 120, the pumping light beam is reflected off a lower surface 180 and sent back to the waveguide 120, as shown by arrows 170. In one embodiment, the reflection at lower surface 180 is due to a change in refractive index, which may be achieved by the lower surface 180 adjoining either a different material, or the same material but having different properties, as is well-known. In one embodiment, the lower surface 180 is adjoining to air or to a heatsink.

In one embodiment, the spacing between the light source 150 and the embedded waveguide 120 is relatively small, e.g., 5 microns. In another embodiment, a lens or collimator may be coupled between the light sources and the substrate.

Figure 5:
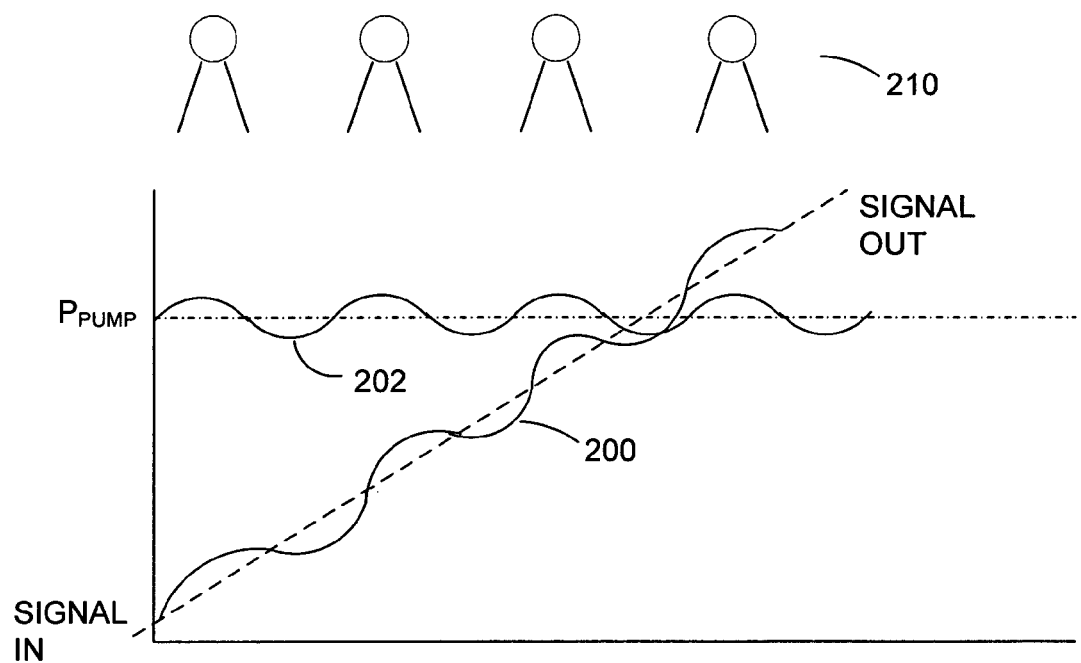
FIG. 5 is a graph showing an example of increase in optical signal power based on optical pumping.

FIG. 5 is an example graph illustrating an increase in optical signal power based on the optical pumping. In one embodiment, the pumping light beams have a power $P_{PUMP}$ that is applied to the optical signal 200. The pump power $P_{PUMP}$ 202 is greatest directly under a light source 210. As the optical signal 200 propagates through the waveguide, it is successively pumped by multiple light sources 210.

In one embodiment, multiple waveguides may be embedded in the same substrate. Each waveguide may have a set of transverse pumps for amplifying an optical signal within the waveguide. In one embodiment, the transverse pumps are VCSELs. A matrix of VCSELs fabricated on a common substrate may be used to amplify optical signals in multiple waveguides.

Thus, an apparatus and method for amplifying an optical signal is disclosed. However, the specific arrangements and methods described herein are merely illustrative. For example, there are various ways to fabricate a waveguide embedded in a substrate, such as by diffusion of various ionic species, etching, and epitaxial growth. One skilled in the art could use any of various methods to fabricate such an embedded waveguide. Numerous modifications in form and detail may be made without departing from the scope of the invention as claimed below. The invention is limited only by the scope of the appended claims.

What is claimed is:

1. An apparatus comprising:
   a first substrate having a waveguide embedded therein, the waveguide to propagate an optical signal;
   a second substrate bonded over the first substrate, the second substrate having a plurality of lasers, the plurality of lasers directly over the waveguide and spaced along a length of the waveguide, the plurality of lasers to emit light in a direction that is transverse to a direction of propagation of the optical signal in the waveguide, the light emitted from the plurality of lasers to pump the optical signal.

2. The apparatus of claim 1, wherein the light emitted by the plurality of lasers is emitted downward, and wherein the direction of the emitted light is perpendicular to an upper surface of the first substrate and to the direction of propagation.

3. The apparatus of claim 1, further comprising a reflector disposed on an opposite side of the first substrate as the second substrate is bonded over, the reflector to reflect at least a portion of light emitted from the plurality of lasers into the waveguide, the reflected light to pump the optical signal.

4. The apparatus of claim 1, wherein the plurality of lasers comprises five lasers, wherein the plurality of lasers are spaced evenly apart along the length of the waveguide, wherein the plurality of lasers have a lithographically defined spacing,
   wherein the plurality of lasers each operate at less than 50 mW, and wherein the waveguide is doped with a rare earth element.

5. An apparatus comprising:
   a first substrate;
   a waveguide embedded within the first substrate to propagate an optical signal; and
   a second substrate having a plurality of light sources, the second substrate positioned over a first side of the first substrate, with the plurality of light sources spaced along a length of the waveguide, the plurality of light sources to emit light in a direction that is transverse to a direction of propagation of the optical signal in the waveguide, the light emitted from the plurality of light sources to pump the optical signal.

6. The apparatus of claim 5, wherein the waveguide is directly under the plurality of light sources.

7. The apparatus of claim 6, wherein the light emitted by the plurality of light sources is emitted downward and in a direction that is perpendicular to the first side of the first substrate and to the direction of propagation.

8. The apparatus of claim 5, wherein the second substrate is bonded to the first substrate.

9. The apparatus of claim 5, further comprising a reflector disposed on a second side of the first substrate to reflect at least a portion of light emitted from the plurality of light sources into the waveguide, the reflected light to pump the optical signal.

10. The apparatus of claim 9, wherein the reflector comprises a surface adjoined to a heatsink.

11. The apparatus of claim 5, wherein the plurality of light sources comprises at least five light sources.

12. The apparatus of claim 5, wherein the plurality of light sources are spaced evenly apart along the length of the waveguide.

13. The apparatus of claim 12, wherein the plurality of light sources have a lithographically defined spacing.

14. The apparatus of claim 5, wherein the plurality of light sources each operate at less than 50 mW.

15. The apparatus of claim 14, wherein the plurality of light sources each operate at less than 20 mW.

16. The apparatus of claim 5, wherein the plurality of light sources comprises at least one vertical cavity surface emitting laser (VCSEL).

17. The apparatus of claim 5, wherein the waveguide is doped with erbium, and wherein light emitted from the light sources has a wavelength of approximately 980 nanometers or approximately 1480 nanometers.

* * * * *